United States Patent [19]

Skingley

[11] 4,283,641
[45] Aug. 11, 1981

[54] FEEDBACK BIASING CIRCUIT ARRANGEMENT FOR TRANSISTOR AMPLIFIER

[75] Inventor: John A. Skingley, Purton, England

[73] Assignee: Plessey Handel und Investments AG, Zug, Switzerland

[21] Appl. No.: 953,206

[22] Filed: Oct. 20, 1978

[30] Foreign Application Priority Data

Oct. 21, 1977 [GB] United Kingdom ............... 43866/77

[51] Int. Cl.³ .......................... H03K 3/01; H03K 3/26
[52] U.S. Cl. ................................ 307/297; 307/296 R; 307/310; 307/491; 307/493
[58] Field of Search ............... 307/296, 297, 310, 229, 307/230; 330/296, 289

[56] References Cited

U.S. PATENT DOCUMENTS

| | | | |
|---|---|---|---|
| 3,659,121 | 4/1972 | Frederiksen | 330/296 |
| 3,721,893 | 3/1973 | Davis | 330/257 |
| 3,831,040 | 8/1974 | Nanba et al. | 307/297 |
| 3,906,386 | 9/1975 | Hongu et al. | 330/296 |
| 3,990,018 | 11/1976 | Nakagomi | 330/257 |

Primary Examiner—Stanley D. Miller, Jr.
Assistant Examiner—B. P. Davis
Attorney, Agent, or Firm—Fleit & Jacobson

[57] ABSTRACT

A circuit suitable for providing constant current bias for I.C's includes two transistors arranged to pass current in parallel in which base emitter voltage applied to one transistor is derived from the base emitter voltage applied to the other transistor with the base emitter voltage applied to the one transistor reduced by a component proportional to the magnitude of the current passed by the other transistor.

4 Claims, 4 Drawing Figures

FEEDBACK BIASING CIRCUIT ARRANGEMENT FOR TRANSISTOR AMPLIFIER

This invention relates to a circuit arrangement.

According to this invention there is provided a circuit arrangement comprising two transistors arranged to pass current in parallel and in which base-emitter voltage applied to one transistor is derived from the base-emitter voltage applied to the other transistor and means are provided for reducing the base-emitter voltage applied to said one transistor by a component proportional to the magnitude of the current passed by the other transistor.

Conveniently the said means for reducing the base-emitter voltage applied to the said one transistor is effective for subtracting from the base-emitter voltage applied to the said other transistor, a component proportional to the current passed by the said other transistor and in a preferred form comprises a resistor arranged in the collector current path of the other transistor and connected such that the potential drop across the resistor is subtracted from the base-emitter voltage of the other transistor.

Advantageously the circuit arrangement is provided as a monolithic integrated circuit.

The effect of reducing the base-emitter voltage applied to the said one transistor by a component proportional to the current through the other transistor is to provide a current through the said one transistor which increases with increasing current through the other transistor until such time as the subtracted component approaches the value of the potential drop across the internal emitter resistance of the other transistor, at which time further increase in current through the other transistor, and consequently in its base-emitter voltage, is offset by the subtracted component and the said one transistor receives a substantial constant base-emitter voltage, and provides a substantially constant output current, over a range of values of current passed by the other transistor.

The circuit arrangement of the invention finds application in the provision of a constant current source.

In an embodiment employing the circuit arrangement of the invention the said one transistor is arranged to provide tail current for a differential amplifier stage.

As the current through the other transistor further increases the subtracted component becomes dominant and the current passed by the one transistor decreases.

In a further embodiment employing the circuit arrangement of the invention in this latter mode of operation there is provided a transistor amplifier comprising a transistor and in which to provide automatic biasing of the base-emitter junction of the said transistor the said other transistor is arranged to have its collector-emitter current path in series with the collector of a further transistor, and the collector of the said one transistor is arranged to provide base bias current for the said further transistor.

The collector of the said one transistor is preferably decoupled to signal frequencies handled by the said further transistor to reduce substantially signal feedback to the base of the said further transistor.

This invention will now be described further by way of example with reference to FIGS. 1 to 4 of the accompanying drawings in which.

Figure 1:
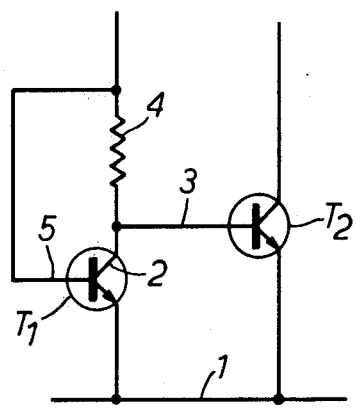
FIG. 1 shows a circuit arrangement useful for explaining this invention.

Referring to FIG. 1 two transistors $T_1$, $T_2$ are arranged to pass current in parallel. Input current to the circuit arrangement flows through the transistor $T_1$ and output current flows through the transistor $T_2$.

The transistor $T_1$ and $T_2$ both have emitters connected to a reference potential 1 which is conveniently ground potential. The transistor $T_1$ has a collector 2 which is connected to the base 3 of the transistor $T_2$.

The transistor $T_1$ has a collector resistor 4, the end remote from the collector 2 being connected to base 5 of the transistor $T_1$.

In operation input current flows through the collector-emitter path of the transmitter $T_1$. The connection between the resistor 4 and the base 5 is such that the potential drop across the resistor 4 due to the current flow is subtracted from the base-emitter voltage of the transistor $T_1$. This potential drop is proportional to the magnitude of the current flow.

The base-emitter voltage applied to the transistor $T_2$ is derived from and, in the absence of the resistor 4 would be the same as, that applied to the transistor $T_1$ but, in the presence of the resistor 4, the base-emitter voltage across transistor $T_1$ is reduced by the potential drop across the resistor 4 to get the base-emitter voltage across transistor $T_2$.

At low currents the resistor 4 has little effect and increasing current through the transistor $T_1$ will result in increasing output current flow through the transistor $T_2$. As the current through the transistor $T_1$ increases the effect of the resistor 4 will increase until the potential drop across it equals that across the transistor internal emitter resistance. At this point any increase in the base-emitter voltage of the transistor $T_1$ is offset by the potential drop across the resistor 4 and the transistor $T_2$ will receive a substantially constant base-emitter voltage resulting in a constant output current.

Further significant increase in the current flow through the transistor $T_1$ results in the potential drop across the resistor 4 becoming dominant and the output current through the transistor $T_2$ will decrease with increasing input current through $T_1$.

If the output current flow through $T_2$ is $i_{out}$ and the ratio of the sizes of the transistors $T_1$ and $T_2$ is N Then output current is given by $$i_{out} = N i_{in} \exp(-i_{in} R / V_o)$$

where $i_{in}$ is the input current through $T_1$

R is the value of the resistor 4 and $$V_o = kt/q$$

k being Boltzmann's constant t absolute temperature and q the charge on an electron.

The condition for constant output current occurs when $$R = V_o / i_{in}$$

and under these conditions the output current becomes $$i_{out} = i_{in}N/e$$

where e is the natural logarithmic base so that for equal output and input currents $$N = e$$

Under the above conditions the temperature coefficient of the output current of the arrangement is positive and inversely proportional to the absolute temperature. This coefficient is equal and opposite to that due to the internal emitter resistance of a transistor and thus an amplifier may be made to have a zero temperature coefficient of gain from this cause.

The value of the resistor R may only be chosen for one input current $i_o$ and one temperature $t_o$.

For other currents $i_{out} = i_{in}N \exp(i_{in}/i_o)$ and at other temperatures $$i_{out} = i_{in}N\exp(-t_o/t)$$

Figure 2:
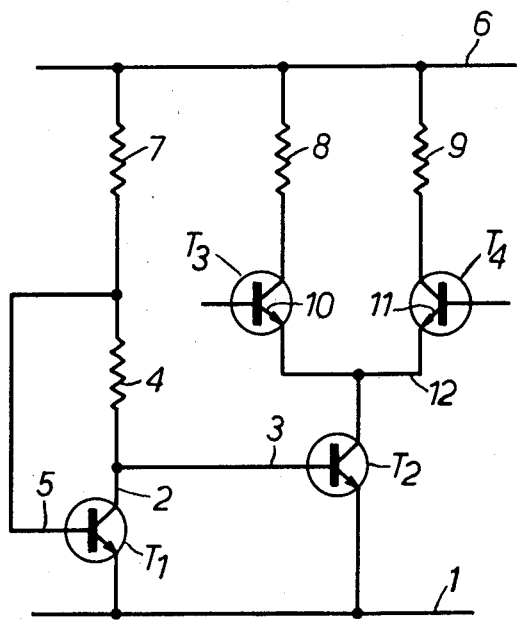
FIG. 2 shows an embodiment of the invention for current biasing a differential amplifier stage.
Figure 3:
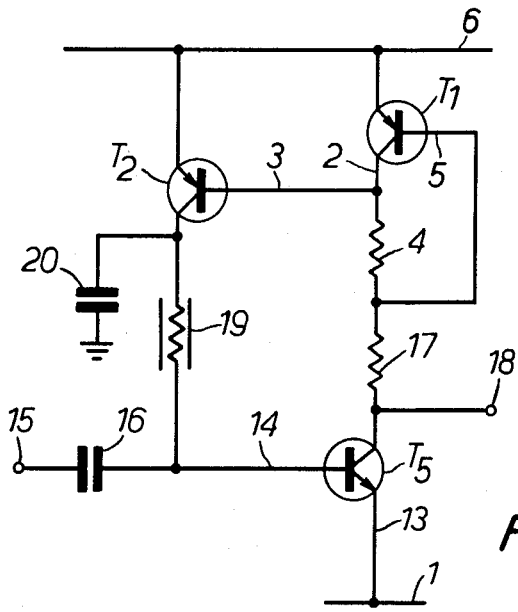
FIG. 3 shows an embodiment for providing base bias for a transistor amplifier.

The circuit arrangement of the invention is particularly applicable to circuit biasing and two typical embodiments are shown in FIGS. 2 and 3 where like reference numerals to FIG. 1 denote like parts.

In FIG. 2 the arrangement of FIG. 1 is used in its constant current region to provide a substantially constant supply independent tail current for a differential amplifier stage.

Supply voltages are supplied by positive and negative rails 6 and 1 respectively. The transistor $T_1$ is arranged with its collector-emitter path between the rails 6 and 1 there being an additional resistor 7 in series with the resistor 4 between the collector 2 and the rail 6. The resistor 4 is connected at its junction with the resistor 7 to the base 5 of $T_1$.

The differential stage comprises transistors $T_3$ and $T_4$ having respective collector resistors 8 and 9 and respective emitters 10, 11 which are coupled by a connection 12.

The transistor $T_2$ is arranged to have its collector-emitter path between the connection 12 and the rail 1 to provide a constant tail current source for the differential stage formed by $T_3$ and $T_4$.

Circuit values are chosen so that the current flow through $T_2$ is equal to that through $T_1$ and is substantially independent of supply voltage. Typical component values are 5.3K for the resistor 7 and 25 for the resistor 4 to provide a tail current through $T_2$ of 1 mA from a 6 V supply. The ratio of the sizes of the transistors $T_1$ and $T_2$ is e. The tail current through $T_2$ is found to be less than 10% below the selected value for supply voltages of between 4 v and 8.8 v and less than 20% low from 3.2 v to 10 v.

Referring to FIG. 3 the circuit arrangement of FIG. 1 is provided for operation in the decreasing output current region for feedback biasing a transistor amplifier. The amplifier comprises a transistor $T_5$ having an emitter 13 connected to the supply rail 1. The transistor $T_5$ has a base 14 to which are fed, in operation, input signals from a terminal 15 via a d.c. isolating capacitor 16. The amplifier has a collector load resistor 17 and output signals are taken from a terminal 18 connected to the collector of $T_5$.

The transistor $T_1$ is connected to pass current in series with $T_5$ and the emitter of $T_1$ is connected to the supply rail 6 whilst the collector resistor 4 joins the resistor 17, the connection between the resistor 4 and the base 5 of $T_1$ being taken from the junction point of the resistors 4 and 17. The collector of $T_2$ is coupled via a signal decoupling sandwich resistor 19 to the base 14 of $T_5$ whilst the emitter of $T_2$ is connected to the rail 6. A decoupling capacitor 20 is connected between the collector $T_2$ and circuit ground to provide additional signal feedback protection. The transistors $T_1$ and $T_2$ are of opposite type to that of $T_5$ and have sizes in the ratio 1:1.

The collector current $i_c$ of the transistor $T_5$ is given by $$i_c = V_o/R . 1_n(NB)$$

where B is the d.c. current gain i.e. $h_{Fe}$ of the transistor $T_5$. The operation of the biasing circuit is to reduce the effect of variations in transistor B values for the transistor $T_5$ on the collector current of that transistor. In a typical example the variation of $i_c$ due to B is from 0.82 mA at B=40 to 1.18 mA at B=200.

Figure 4:
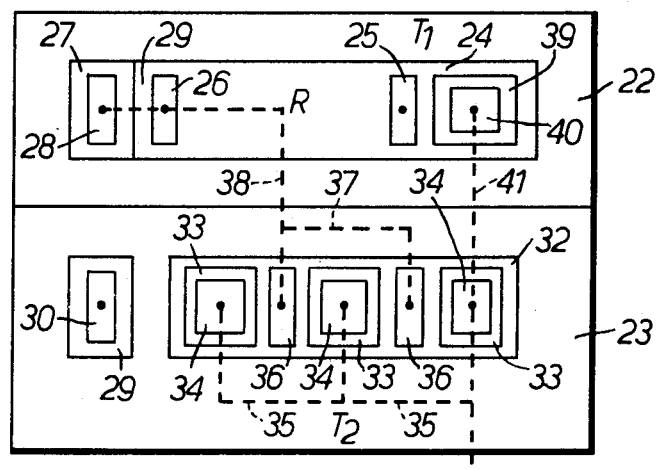
FIG. 4 shows schematically an integrated circuit layout of the arrangement of FIG. 1.

The circuit arrangement of the invention is suitable for fabrication as an integrated circuit and an exemplary layout is shown in FIG. 4.

In FIG. 4 a semiconductor substrate 21 has two isolation areas 22 and 23, the area 22 being provided for fabrication of the transistor $T_1$ and the resistor 4 designated R in this Figure of the drawings whilst the area 23 is provided for fabrication of the transistor $T_2$.

Defined in the area 22 is a base diffused region 24 for $T_1$ and this region 24 has a metallised base contact 25 which also forms one electrode of the resistor R which is formed as an extension of the base diffused region 24 and has a second metallised contact 26. The transistor $T_1$ also has a collector area 27 provided with a metal contact area 28. The collector contact 28 of $T_1$ is connected to the second contact 26 of the resistor R by a metal interconnection illustrated by dashed line 29.

The transistor $T_2$ provided within the isolation region 23 has a collector region 30 provided with metal contact 31 from which output current is taken. Within the area 23 $T_2$ is provided with a diffused base region 32. $T_2$ is envisaged as a multiple emitter transistor and in the example has three emitter diffused regions 33 each having a metal contact 34 which contacts are interconnected by dashed metal connections 35. Between each pair of emitter regions 34 is provided base contacts 36 which are interconnected by the metal connections illustrated by dashed lines 37. The bases of the transistor $T_2$ are also interconnected to the collector region 27 of $T_1$ by metal interconnections shown dashed at 38. Finally the transistor $T_1$ has an emitter diffused region 39 provided with metal contact 40 which is connected to the emitter contact 34 of $T_2$ by metal interconnection shown dashed at 41 which also connects the emitters of both transistors to circuit ground.

The arrangement of the present invention may be employed with either NPN or PNP transistors and it must be understood that the embodiments described with reference to the drawings are exemplary and other embodiments and applications may be envisaged and constructed without departing from the scope of the invention.

What we claim is:

1. An amplifier circuit arrangement, comprising:
    first and second transistors, each having a base, an emitter and a collector electrode, the first and second transistors being connected to pass current in parallel with one another;

interconnecting means for interconnecting the first and second transistors so that a base-emitter voltage applied to the first transistor is derived from a base-emitter voltage applied to the second transistor;

biasing reduction means connected between the base and collector of said second transistor for reducing the base-emitter voltage applied to the first transistor by a component proportional to the magnitude of the current passed by the second transistor; and an amplifier transistor having a base input for receiving a signal frequency to be amplified, an emitter; and a collector output for delivering amplified output signals, the collector output of the amplifier transistor being connected to said second transistor so as to pass current in series with the said second transistor, the collector of the said first transistor being connected to the base of said amplifier transistor for providing base bias current thereto.

2. A circuit arrangement as claimed in claim 1, wherein the biasing reduction means comprises a resistor connected such that the potential drop across the resistor is subtracted from the base-emitter voltage of the second transistor to provide the base-emitter voltage applied to the first transistor.

3. A circuit arrangement as claimed in any one of claims 1 and 2, wherein said circuit arrangement comprises a monolithic integrated circuit.

4. An amplifier circuit arrangement, comprising:

first and second transistors, each having a base, an emitter and a collector electrode, the first and second transistors being connected to pass current in parallel with one another;

interconnecting means for interconnecting the first and second transistors so that a base-emitter voltage applied to the first transistor is derived from a base-emitter voltage applied to the second transistor;

biasing reduction means for reducing the base-emitter voltage applied to the first transistor by a component proportional to the magnitude of the current passed by the second transistor; and an amplifier transistor having a base input, an emitter, and a collector output, the amplifier transistor being connected to said second transistor so as to pass current in series with said second transistor, the collector of said first transistor being connected to the base of said amplifier transistor for providing base bias current thereto;

said circuit arrangement further comprising decoupling means connected between the collector of the said first transistor and the base input of the amplifier transistor for decoupling the collector of the said first transistor to signal frequencies handled by the said amplifier transistor in order to reduce substantially signal feed-back to the base of the said amplifier transistor.

* * * * *